(12) United States Patent
Chen et al.

(10) Patent No.: US 9,691,903 B2
(45) Date of Patent: Jun. 27, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chao-Hsuing Chen, Tainan (TW); Hou-Yu Chen, Zhubei (TW); Chie-Iuan Lin, Zhubei (TW); Yuan-Shun Chao, Zhubei (TW); Kuo Lung Li, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/227,134

(22) Filed: Aug. 3, 2016

(65) Prior Publication Data
US 2017/0012128 A1   Jan. 12, 2017

Related U.S. Application Data

(62) Division of application No. 14/793,632, filed on Jul. 7, 2015, now Pat. No. 9,425,313.

(51) Int. Cl.
*H01L 29/66* (2006.01)
*H01L 29/78* (2006.01)
(Continued)

(52) U.S. Cl.
CPC .... *H01L 29/7849* (2013.01); *H01L 21/02123* (2013.01); *H01L 21/02236* (2013.01);
(Continued)

(58) Field of Classification Search
CPC ........... H01L 29/7849; H01L 21/02123; H01L 21/02238
(Continued)

(56) References Cited

U.S. PATENT DOCUMENTS 4,725,918 A   2/1988   Bakker
5,159,535 A   10/1992  Desai et al.
(Continued)

FOREIGN PATENT DOCUMENTS

KR   10-2006-0130704 A   12/2006
KR   10-2015-0060525 A   6/2015
TW      201220494 A      5/2012

OTHER PUBLICATIONS

Notice of Allowance U.S. Appl. No. 14/793,632 dated Apr. 18, 2016.
(Continued)

*Primary Examiner* — Long K Tran
(74) *Attorney, Agent, or Firm* — McDermott Will & Emery LLP

(57) ABSTRACT

In a method for manufacturing a semiconductor device, a fin structure including a first semiconductor layer, an oxide layer disposed over the first semiconductor layer and a second semiconductor layer disposed over the oxide layer is formed. An isolation insulating layer is formed so that the second semiconductor layer of the fin structure protrudes from the isolation insulating layer while the oxide layer and the first semiconductor layer are embedded in the isolation insulating layer. A third semiconductor layer is formed on the exposed second semiconductor layer so as to form a channel.

20 Claims, 5 Drawing Sheets

(51) Int. Cl.
*H01L 21/02* (2006.01)
*H01L 27/088* (2006.01)
*H01L 29/06* (2006.01)
*H01L 29/165* (2006.01)
*H01L 29/10* (2006.01)

(52) U.S. Cl.
CPC .. *H01L 21/02238* (2013.01); *H01L 21/02255* (2013.01); *H01L 27/0886* (2013.01); *H01L 29/0653* (2013.01); *H01L 29/165* (2013.01); *H01L 29/66795* (2013.01); *H01L 29/785* (2013.01); *H01L 29/7853* (2013.01); *H01L 21/0245* (2013.01); *H01L 21/0262* (2013.01); *H01L 21/02532* (2013.01); *H01L 29/1054* (2013.01)

(58) Field of Classification Search
USPC .................................................. 257/190, 192
See application file for complete search history.

(56) References Cited

U.S. PATENT DOCUMENTS

| | | | |
|---|---|---|---|
| 5,170,931 | A | 12/1992 | Desai et al. |
| 5,201,451 | A | 4/1993 | Desai et al. |
| 5,800,194 | A | 9/1998 | Yamagishi |
| 5,847,572 | A | 12/1998 | Iwasaki et al. |
| 5,920,200 | A | 7/1999 | Pendse et al. |
| 6,057,700 | A | 5/2000 | Crispell |
| 6,155,859 | A | 12/2000 | Choy |
| 6,213,806 | B1 | 4/2001 | Choy |
| 6,369,595 | B1 | 4/2002 | Farnworth et al. |
| 6,642,090 | B1 * | 11/2003 | Fried ................ H01L 21/82382 257/E21.635 |
| 7,156,680 | B2 | 1/2007 | Saito |
| 7,232,328 | B2 | 6/2007 | Saito |
| 7,425,740 | B2 | 9/2008 | Liu et al. |
| 7,667,475 | B2 | 2/2010 | Steps et al. |
| 7,704,735 | B2 | 4/2010 | Facer et al. |
| 7,737,710 | B2 | 6/2010 | Cho |
| 7,862,363 | B2 | 1/2011 | Chen et al. |
| 8,048,723 | B2 | 11/2011 | Chang et al. |
| 8,053,299 | B2 | 11/2011 | Xu |
| 8,183,627 | B2 | 5/2012 | Currie |
| 8,415,718 | B2 | 4/2013 | Xu |
| 8,497,177 | B1 | 7/2013 | Chang et al. |
| 8,575,653 | B2 * | 11/2013 | Rachmady ............. B82Y 10/00 257/192 |
| 8,609,518 | B2 | 12/2013 | Wann et al. |
| 8,618,556 | B2 | 12/2013 | Wu et al. |
| 8,622,198 | B2 | 1/2014 | Yamazaki et al. |
| 8,633,516 | B1 | 1/2014 | Wu et al. |
| 8,703,508 | B2 | 4/2014 | Chang et al. |
| 8,703,565 | B2 | 4/2014 | Chang et al. |
| 8,710,859 | B2 | 4/2014 | Chang |
| 8,742,509 | B2 | 6/2014 | Lee et al. |
| 8,776,734 | B1 | 7/2014 | Roy et al. |
| 8,785,285 | B2 | 7/2014 | Tsai et al. |
| 8,796,666 | B1 | 8/2014 | Huang et al. |
| 8,815,712 | B2 | 8/2014 | Wan et al. |
| 8,988,095 | B2 | 3/2015 | Nakamura et al. |
| 9,087,887 | B2 * | 7/2015 | Rachmady ............. B82Y 10/00 |
| 2002/0084532 | A1 | 7/2002 | Neogi et al. |
| 2004/0070414 | A1 | 4/2004 | Tani |
| 2005/0214173 | A1 | 9/2005 | Facer et al. |
| 2005/0218438 | A1 | 10/2005 | Lindert et al. |
| 2008/0088331 | A1 | 4/2008 | Yoshida |
| 2008/0224258 | A1 | 9/2008 | Schepis et al. |
| 2008/0253869 | A1 | 10/2008 | Yun Sung et al. |
| 2009/0015282 | A1 | 1/2009 | Steps et al. |
| 2009/0026199 | A1 | 1/2009 | Jeor |
| 2009/0128177 | A1 | 5/2009 | Ohta |
| 2009/0243644 | A1 | 10/2009 | Chang |
| 2012/0168964 | A1 | 7/2012 | Kim |
| 2013/0076384 | A1 | 3/2013 | Chang |
| 2013/0285153 | A1 | 10/2013 | Lee et al. |
| 2014/0002121 | A1 | 1/2014 | Khoche et al. |
| 2014/0051189 | A1 | 2/2014 | Kai-Jun et al. |
| 2014/0183600 | A1 | 7/2014 | Huang et al. |
| 2014/0264590 | A1 | 9/2014 | Yu et al. |
| 2014/0264592 | A1 | 9/2014 | Oxland et al. |
| 2014/0266281 | A1 | 9/2014 | Wang et al. |
| 2015/0028426 | A1 | 1/2015 | Ching et al. |
| 2015/0137844 | A1 | 5/2015 | Kikuchi et al. |
| 2015/0144998 | A1 | 5/2015 | Ching et al. |
| 2015/0372120 | A1 | 12/2015 | Ching et al. |

OTHER PUBLICATIONS

Office Action Taiwanese Patent Application No. 10520964650 dated Aug. 3, 2016.
Notice of Allowance U.S. Appl. No. 15/250,198 dated Jan. 27, 2017.
Office Action Korean Patent Application No. 10-2015-0169061 dated Feb. 9, 2017.

* cited by examiner

SEMICONDUCTOR DEVICE AND MANUFACTURING METHOD THEREOF

CROSS-REFERENCE TO RELATED APPLICATIONS

This Application is a Divisional Application of U.S. Ser. No. 14/793,632 filed Jul. 7, 2015, the subject matter of which is incorporated herein by reference in entirety.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe), silicon phosphide (SiP) or silicon carbide (SiC), may be used to enhance carrier mobility. Further, channel on oxide structures have been proposed to improve carrier mobility and to maintain a straight fin profile. In addition, strained materials in source/drain (S/D) portions of the Fin FET utilizing selectively grown silicon germanium (SiGe) may be used to enhance carrier mobility. For example, compressive stress applied to a channel of a PMOS device advantageously enhances hole mobility in the channel. Similarly, tensile stress applied to a channel of an NMOS device advantageously enhances electron mobility in the channel. However, there are challenges to implementation of such features and processes in complementary metal-oxide-semiconductor (CMOS) fabrication.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
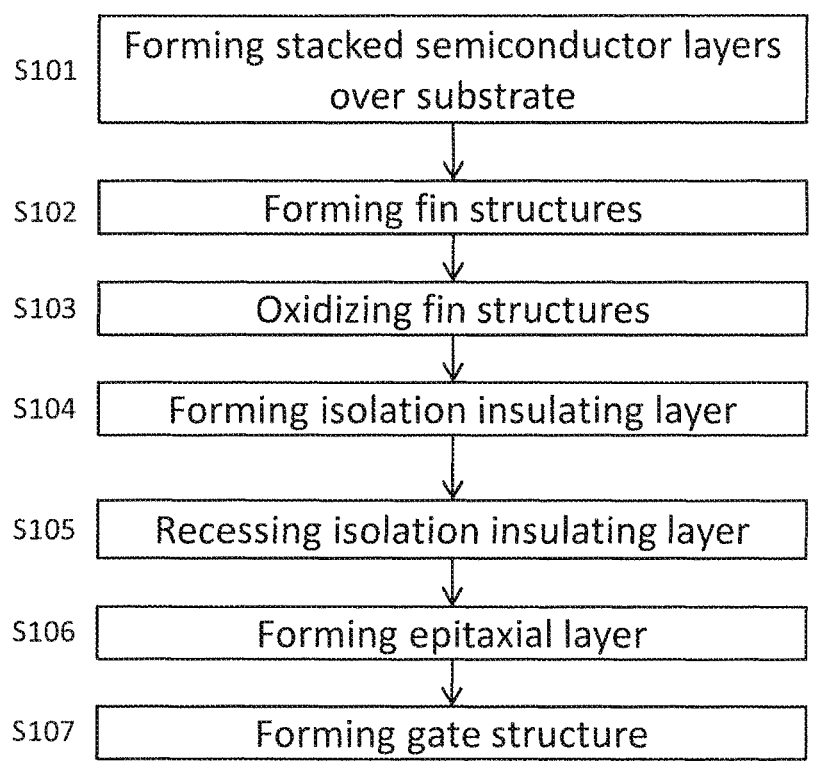
FIG. 1 is an exemplary process flow chart of a semiconductor FET device according to one embodiment of the present disclosure.

FIG. 1 is an exemplary flow chart for manufacturing a semiconductor Fin FET device according to one embodiment of the present disclosure. The flow chart illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

Figure 2:
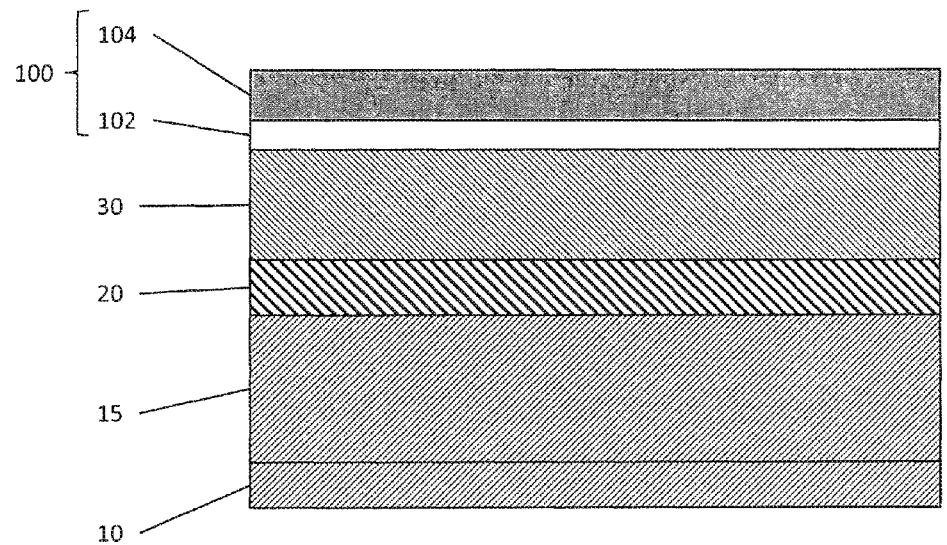
FIGS. 2-8 are exemplary processes for manufacturing a semiconductor FET device according to one embodiment of the present disclosure.

In S101 of FIG. 1, stacked layers of semiconductor materials are formed over a substrate as shown in FIG. 2. The stacked layers of semiconductor materials are formed over a substrate 10 and include a first semiconductor layer 15, an intermediate semiconductor layer 20, and a second semiconductor layer 30.

The substrate 10 is, for example, a p-type silicon substrate with an impurity concentration in a range of about $1\times10^{15}$ cm$^{-3}$ and about $3\times10^{15}$ cm$^{-3}$. In other embodiments, The substrate 10 is an n-type silicon substrate with an impurity concentration in a range of about $1\times10^{15}$ cm$^{-3}$ and about $3\times10^{15}$ cm$^{-3}$. The Si substrate 10 has a (100) upper surface in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on-insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The first semiconductor layer 15 may be part of the substrate implanted with impurities. The ion implantation is performed to prevent a punch-through effect. The dopants are, for example boron ($BF_2$) for an n-type Fin FET and phosphorus for a p-type Fin FET. The first semiconductor layer 15 becomes a well layer of a Fin FET.

In some embodiments, the first semiconductor layer 15 may be epitaxially grown over the substrate 10. The epitaxial layer 15 may be doped by in-situ doping and/or ion implantation.

The intermediate semiconductor layer 20 is epitaxially grown over the surface of the first semiconductor layer 15, and a second semiconductor layer 30 is epitaxially grown over the intermediate semiconductor layer. Further, a mask layer 100, including a first mask layer 102 and a second mask layer 104, is formed over the second semiconductor layer 30.

The intermediate semiconductor layer 20 is, for example, Ge or $Si_{(1-x)}Ge_x$, where x is in a range of about 0.1 to about 0.9. In this embodiment, $Si_{(1-x)}Ge_x$ is used as the intermediate semiconductor layer 20. In the present disclosure, $Si_{1-x}Ge_x$ may be simply referred to as SiGe. The thickness of the SiGe layer 20 is in a range of about 10 nm to about 100 nm in some embodiments. In certain embodiments, the thickness of the SiGe layer 20 is in a range of about 1 nm to about 20 nm, or in a range of about 2 nm to 10 nm in other embodiments.

The epitaxial growth of the SiGe layer may be performed by using $SiH_4$ and/or $SiH_2Cl_2$ and $GeH_4$ as source gases at a temperature in a range of about 500 C to 700 C and at a pressure in a range of about 10 to 100 Torr (about 133 Pa to about 1333 Pa).

The second semiconductor layer 30 is, for example, Si or $Si_{(1-y)}Ge_y$, where y<x. The second semiconductor layer is Si in this embodiment. The Si second semiconductor layer 30 has a thickness in a range of about 20 nm to about 200 nm in some embodiments. In certain embodiments, the thickness of the Si second semiconductor layer 30 is in a range of about 50 nm to about 100 nm. The epitaxial growth of the Si layer may be performed by using $SiH_4$ and/or $SiH_2Cl_2$ as source gases at a temperature in a range of about 500 C to 700 C and at a pressure in a range of about 10 to 100 Torr (about 133 Pa to about 1333 Pa).

The mask layer 100 may include, for example, a pad oxide (e.g., silicon oxide) layer 102 as a first mask layer and a silicon nitride (SiN) mask layer 104 as a second mask layer. The thickness of the pad oxide layer 102 is in a range of about 2 nm to about 15 nm and the thickness of the silicon nitride mask layer 104 is in a range of about 10 nm to about 50 nm in some embodiments.

Figure 3:
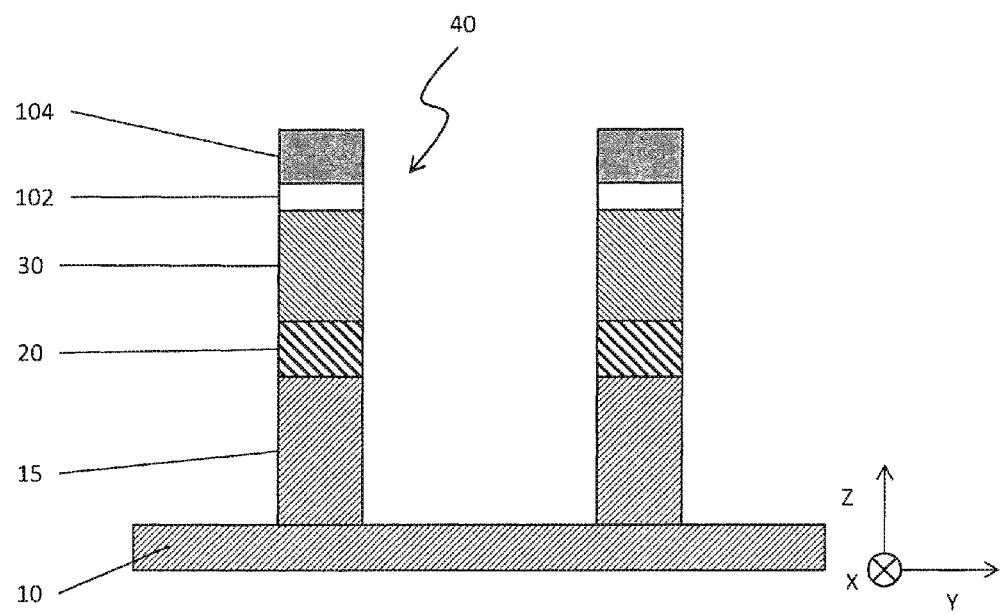

In S102 of FIG. 1, the stacked layers of semiconductor materials with the mask layer are patterned into fin structures 40 extending in the X direction, as shown in FIG. 3.

By using patterning operations, the mask layer 100 is patterned into mask patterns. The width of each of the patterns is in a range of about 5 nm to about 40 nm in some embodiments, or may be in a range of about 10 nm to about 30 nm in other embodiments.

As shown in FIG. 3, by using the mask patterns as etching masks, the second semiconductor layer 30, the intermediate semiconductor layer 20 and the first semiconductor layer 15 are patterned into fin structures 40 by trench etching using a dry etching method and/or a wet etching method. In some embodiments, part of the substrate 10 may also be etched.

In FIG. 3, two fin structures 40 are disposed adjacent to each other. However, the number of the fin structures is not limited to two. The numbers may be one, three, four or five or more. In addition, one or more dummy fin structures may be disposed adjacent to both sides of the fin structures 40 to improve pattern fidelity in patterning processes. The width (in the Y direction) of the fin structure 40 is in a range of about 5 nm to about 40 nm in some embodiments, and may be in a range of about 7 nm to about 15 nm in certain embodiments. The height in the Z direction of the fin structure 40 is in a range of about 100 nm to about 300 nm in some embodiments, and may be in a range of about 50 nm to 100 nm in other embodiments. The space between the fin structures 40 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits. Further, in some embodiment, at least one of the fin structures 40 is for an n-type Fin FET and at least one of the fin structures 40 is for a p-type Fin FET.

It is noted that in one embodiment of the present disclosure, the width of fin structure 40 may be set smaller than a target channel width.

Figure 4:
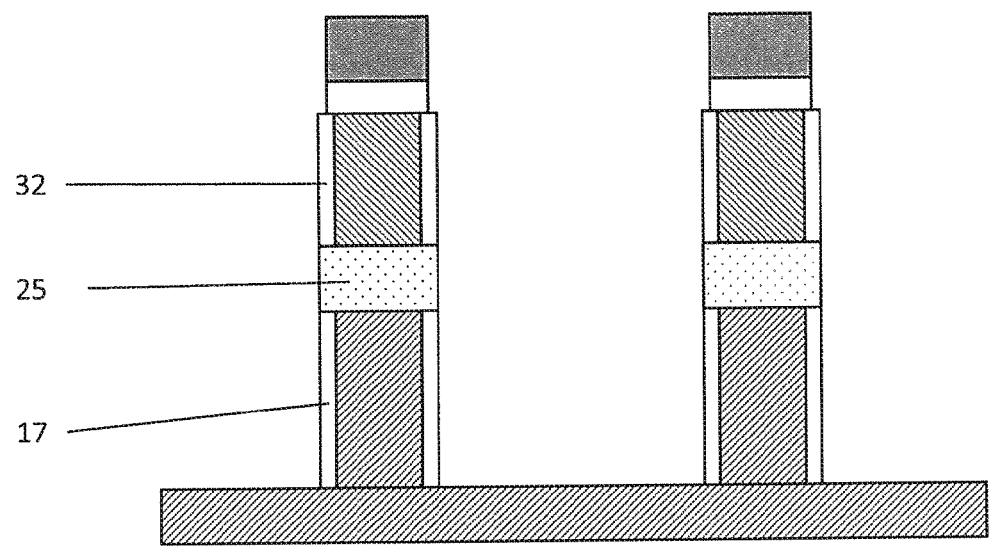

In S103 of FIG. 1, the intermediate semiconductor layers 20 in the fin structures 40 are oxidized. In one embodiment of the present disclosure, the intermediate semiconductor 20 is SiGe and the first and intermediate semiconductor layers are Si, and the SiGe layer 20 is oxidized to form SiGe oxide layers 25, as shown in FIG. 4.

Since SiGe (in particular Ge) is oxidized faster than Si, the SiGe oxide layers 25 can be selectively formed. However, side walls of the Si first semiconductor layers 15 and the Si second semiconductor layers 30 may also be slightly oxidized to form silicon oxide layers 17 and 32.

The SiGe layer can be oxidized by an annealing or heating in an atmosphere containing oxygen ($O_2$), $O_2$ and hydrogen ($H_2$) or steam ($H_2O$). In this embodiment, wet oxidation using steam is performed at a temperature range of about 400° C. to about 800° C. for about one hour to four hours, at about atmospheric pressure. The thickness of the SiGe oxide layers 25 is in a range of about 5 nm to 25 nm in some embodiments, or about 10 nm to 20 nm in other embodiments. By this oxidation operation, the intermediate semiconductor layers 20 (SiGe) are fully oxidized.

In some embodiments of the present disclosure, the silicon oxide layers 17, 32 and part of the SiGe oxide layer 25 may optionally be removed, by using, for example, wet etching. The etchant of the wet etching may be dilute HF. By adjusting the etching conditions (e.g., etching time), the silicon oxide layers 17, 32 formed on the side walls of the first and second Si layers may be removed. The SiGe oxide layer 25 is also slightly etched.

Figure 5:
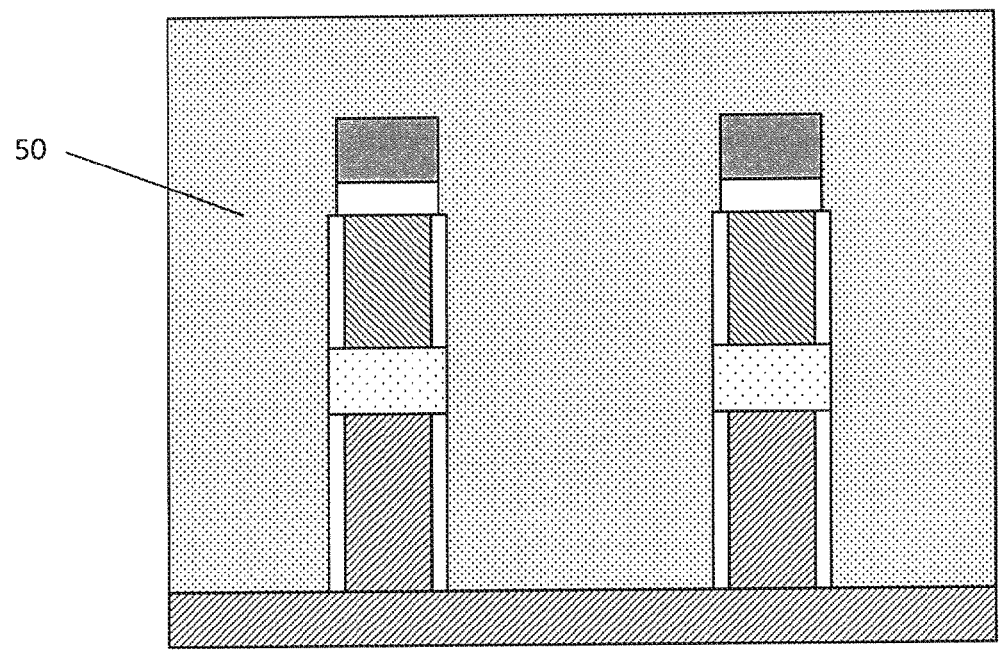

In S104 of FIG. 1, an isolation insulating layer 50 is formed over the substrate 10 and the fin structures 40, as shown in FIG. 5. The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densities and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

After forming the isolation insulating layer 50, a thermal process, for example, an anneal process, may be performed to improve the quality of the isolation insulating layer 50. The thermal process may be performed before or after the planarization operations.

Figure 6:
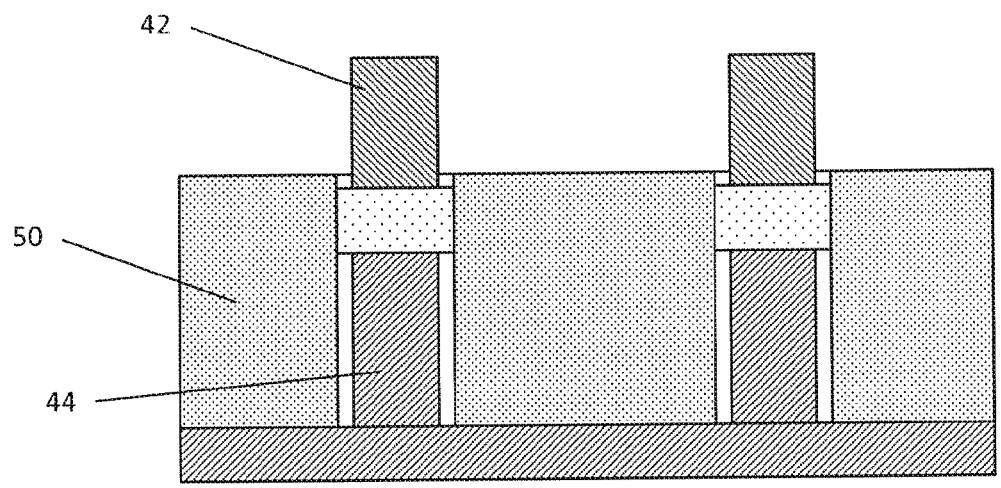

In S105 of FIG. 1, the thickness of the isolation insulating layer 50 is reduced by, for example, a planarization process including a chemical mechanical polishing (CMP) method and/or an etch-back process, so as to expose a part of the fin structures 40, as shown in FIG. 6. During the planarization operations, the mask patterns 100 and atop portion of the isolation insulating layer 50 are removed. Further, by an etch-back process, the thickness of the isolation insulating layer 50 is reduced.

A portion of the fin structure including the exposed part 42 of the fin structure 40 becomes a channel of the Fin FET and a portion of the fin structure the embedded in the isolation insulating layer becomes a well layer 44 of the Fin FET. The etch-back operations may be performed by using dry etching or wet etching. By adjusting etching time, a desired thickness of the remaining isolation insulating layer 50 can be obtained.

In FIG. 6, the SiGe oxide layer 25 is not exposed from the isolation insulating layer 50, and the bottom of the channel layer 42 is embedded in the isolation insulating layer 50. However, in some embodiments, the SiGe oxide layer 25 and the entire channel layer 42 may be exposed from the isolation insulating layer 50.

Figure 7:
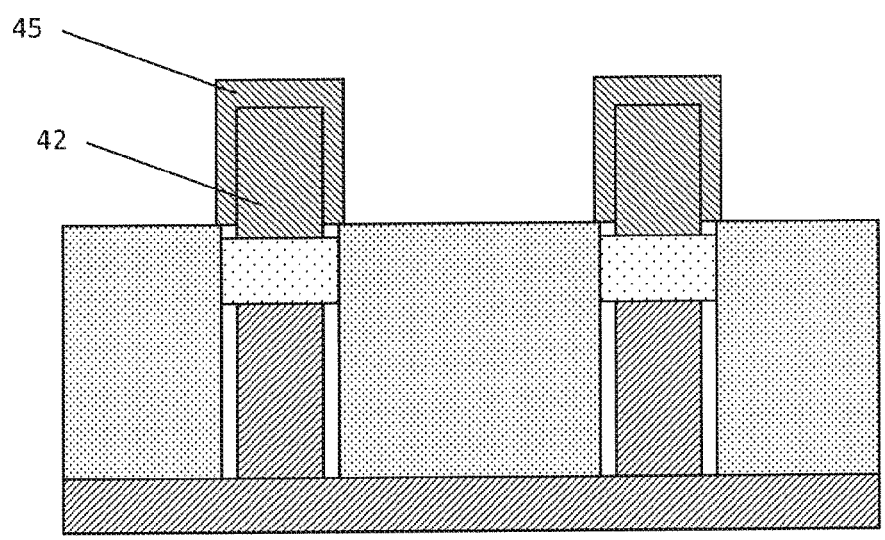

In S106 of FIG. 1, a third semiconductor layer 45 is formed over the channel layer 42 to adjust the width of the channel of the Fin FET (in the Y direction), as shown in FIG. 7.

As set forth above, the side wall of the first and second semiconductor layers (Si) 15, 30 are oxidized during the oxidization of SiGe layer 20. To fully oxidize the SiGe layer 20, the thickness of the silicon oxide layers formed over the first and second semiconductor layers (Si) 15, 30 tends to become thick, which in turn reduces the width of the fin structure. In particular, the width of the upper portion of the fin structure to be a channel would be reduced.

However, by forming the third semiconductor layer 45 over the channel layer 42, the width of the channel of the Fin FET can be recovered and a desired channel width can be obtained. As shown in FIG. 7, the width of the channel of the Fin FET with the third semiconductor layer 45 is generally greater than the width of the well layer 44.

The third semiconductor layers 45 are epitaxially formed on the channel layer 42 and include silicon when the channel layer 42 is silicon. In some embodiments, the third semiconductor layers 45 may include Si and Ge, and may also include additional material such as phosphorous and/or carbon. The third semiconductor layers 45 may be appropriately doped with dopants during the epitaxial growth or may not be doped.

The epitaxial growth of the Si third semiconductor layer 45 may be performed by using $SiH_4$ and/or $SiH_2Cl_2$ as source gases at a temperature in a range of about 500 C to 700 C and at a pressure in a range of about 10 to 100 Torr (about 133 Pa to about 1333 Pa).

In the present embodiment, the third semiconductor layer 45 is made of silicon, and the channel of the Fin FET formed by the channel layer 42 and the third semiconductor layer 45 does not contain Ge. As set forth above, the SiGe layers 20 are fully oxidized and no SiGe semiconductor layer remains. Accordingly, during the epitaxial growth of the third semiconductor layer 45, no Ge is diffused from the SiGe layer. In some embodiments of the present disclosure, no signal corresponding to Ge is observed at a bottom of the channel layer 42 by EDX (Energy dispersive X-ray spectrometry), which shows that no Ge diffusion into the channel layer.

Figure 8:
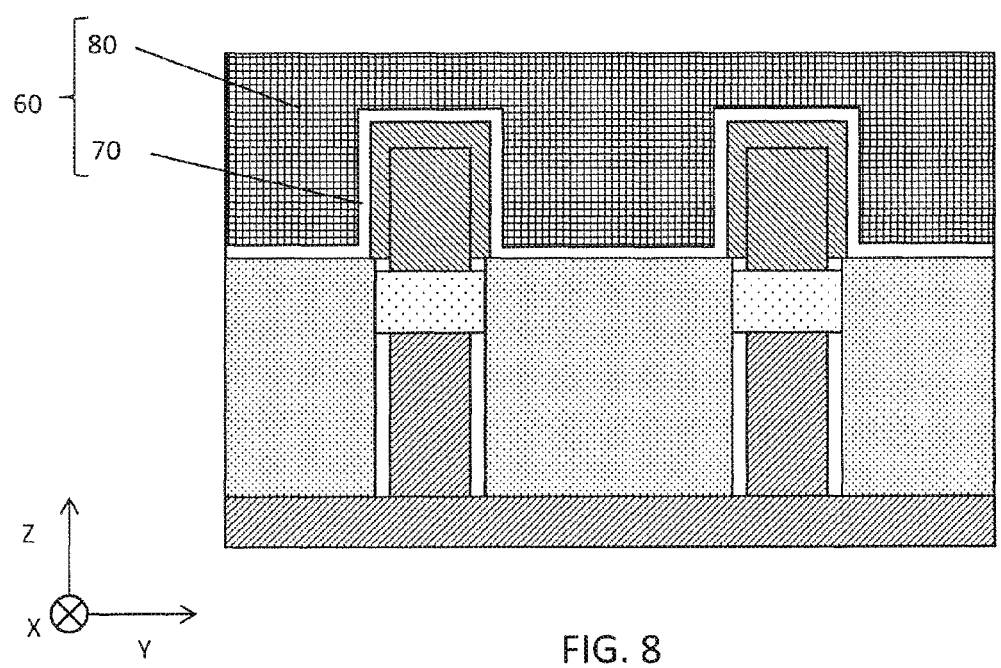

In S107 of FIG. 1, a gate structure 60 is formed over part of the channel layers 42 of the fin structures 40. The gate structure 60 extends in the Y direction and includes a gate dielectric layer 70 and an electrode layer 80. Although one gate structure 60 is formed for two fin structures in FIG. 8, two gate structures may be formed for two fin structures, respectively.

A gate dielectric material and an electrode material are formed over the isolation insulating layer 50 and the channel layer 42, and then patterning operations are performed so as to obtain gate structure including the gate electrode layer 80 and the gate dielectric layer 70. The gate electrode layer 80 is poly silicon in this embodiment. The patterning of the poly silicon layer is performed by using a hard mask including a silicon nitride layer and an oxide layer in some embodiments. The gate dielectric layer may be silicon oxide formed by CVD, PVD, ALD, e-beam evaporation, or other suitable process.

In one embodiment, a gate-last technology (a gate replacement technology) is employed. In the gate-last technology, the gate electrode layer 80 and the gate dielectric layer 70 formed in the foregoing operations are a dummy electrode layer and a dummy gate dielectric layer, respectively, which are eventually removed.

In some embodiments, the gate dielectric layer 70 may include one or more layers of silicon oxide, silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer 70 is in the range of about 1 nm to 5 nm. In some embodiments, the gate dielectric layer 70 may include an interfacial layer made of silicon dioxide. In some embodiments, the gate electrode layer 80 may comprise a single layer or multilayer structure.

Further, the gate electrode layer 80 may be doped poly-silicon with uniform or non-uniform doping. In some alternative embodiments, the gate electrode layer 80 may include a metal such as Al, Cu, W, Ti, Ta, TiN, TiAl, TiAlN, TaN, NiSi, CoSi, other conductive materials with a work function compatible with the substrate material, or combinations thereof. The electrode layer for the gate electrode layer 80 may be formed using a suitable process such as ALD, CVD, PVD, plating, or combinations thereof. The width of the gate electrode layer 80 (in the X direction) is in the range of about 30 nm to about 60 nm in some embodiments.

It is understood that the Fin FET device may undergo further CMOS processes to form various features such as side wall insulating layers, source/drain structures, interlayer insulating layers, contacts/vias, interconnect metal layers, dielectric layers, passivation layers, etc.

The various embodiments or examples described herein offer several advantages over the existing art. In some embodiments of the present disclosure, after the channel layers are exposed from the isolation insulating layer, an epitaxial channel layer is formed to increase the width of the channel of the Fin FET, thereby obtaining a desired channel width.

With the formation of the epitaxial channel layer to recover the channel width, it is possible to fully oxidize the SiGe layers into SiGe oxide without taking care of the loss of the channel width during the SiGe layer oxidation, which make process windows for oxidizing the SiGe layer broader. Further, since it is possible to make the width of the fin structures (after etching) smaller, the time for fully oxidizing the SiGe layer can become shorter, thereby reducing thermal histories. In addition, the thickness of silicon oxide layers, which causes the loss of the channel width, can be minimized.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a fin structure including a first semiconductor layer, an oxide layer disposed over the first semiconductor layer and a second semiconductor layer disposed over the oxide layer is formed. An isolation insulating layer is formed so that the second semiconductor layer of the fin structure protrudes from the isolation insulating layer and is exposed while the oxide layer and the first semiconductor layer are embedded in the isolation insulating layer. A third semiconductor layer is formed on the exposed second semiconductor layer so as to form a channel layer.

In accordance with another aspect of the present disclosure, in a method for manufacturing a semiconductor device, a stack of semiconductor layers is formed. The stack includes a first semiconductor layer, an intermediate semiconductor layer formed over the first semiconductor layer, and a second semiconductor layer formed over the intermediate semiconductor layer. A fin structure is formed, by patterning the first semiconductor layer, the intermediate semiconductor layer and the second semiconductor layer. The intermediate semiconductor layer in the fin structure is oxidized. An isolation insulating layer is formed so that the second semiconductor layer of the fin structure protrudes from the isolation insulating layer and is exposed while the oxidized intermediate layer and the first semiconductor layer are embedded in the isolation insulating layer. A third semiconductor layer is formed on the exposed second semiconductor layer so as to form a channel layer.

In accordance with another aspect of the present disclosure, a semiconductor device includes a Fin FET device. The Fin FET device includes a fin structure and a gate stack. The fin structure extends in a first direction and protrudes from an isolation insulating layer. The fin structure includes a well layer, an oxide layer disposed over the well layer and a channel layer disposed over the oxide layer. The gate stack includes a gate electrode layer and a gate dielectric layer, covering a portion of the channel layer and extends in a second direction perpendicular to the first direction. A width of the well layer in the second direction is smaller than a width of the channel layer in the second direction The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a Fin FET device including:
      a fin structure extending in a first direction and protruding from an isolation insulating layer, the fin structure including a well layer, an oxide layer disposed over the well layer and a channel layer disposed over the oxide layer; and
      a gate stack including a gate electrode layer and a gate dielectric layer, covering a portion of the channel layer and extending in a second direction perpendicular to the first direction,
   wherein a width of the well layer in the second direction at an interface between the well layer and the oxide layer is smaller than a width of the channel layer in the second direction.

2. The semiconductor device of claim 1, wherein the oxide layer includes SiGe oxide.

3. The semiconductor device of claim 2, wherein the oxide layer does not include a semiconductor SiGe.

4. The semiconductor device of claim 1, wherein the channel layer does not contain Ge.

5. The semiconductor device of claim 1, wherein the oxide layer is fully embedded in the isolation insulating layer.

6. The semiconductor device of claim 5, wherein a thickness of the oxide layers is in a range of 5 nm to 25 nm.

7. A semiconductor device, comprising:
   a Fin FET device including:
      a first fin structure and a second fin structure, both extending in a first direction and protruding from an isolation insulating layer, each of the first and second fin structures including a well layer, an oxide layer disposed over the well layer and a channel layer disposed over the oxide layer; and
      a gate stack including a gate electrode layer and a gate dielectric layer, covering a portion of the channel layer of the first fin structure and a portion of the channel layer of the second fin structure, and extending in a second direction perpendicular to the first direction,
   wherein a width of the well layer of the first fin structure in the second direction at an interface between the well layer of the first fin structure and the oxide layer of the first fin structure is smaller than a width of the channel layer of the first fin structure in the second direction.

8. The semiconductor device of claim 7, wherein the oxide layer includes SiGe oxide.

9. The semiconductor device of claim 8, wherein the oxide layer does not include a semiconductor SiGe.

10. The semiconductor device of claim 7, wherein the channel layer does not contain Ge.

11. The semiconductor device of claim 7, wherein the oxide layer is fully embedded in the isolation insulating layer.

12. The semiconductor device of claim 11, wherein a thickness of the oxide layers is in a range of 5 nm to 25 nm.

13. A semiconductor device, comprising:
a Fin FET device including:
    a fin structure extending in a first direction and protruding from an isolation insulating layer, the fin structure including a well layer, an oxide layer disposed over the well layer and a channel layer disposed over the oxide layer; and
    a gate stack including a gate electrode layer and a gate dielectric layer, covering a portion of the channel layer and extending in a second direction perpendicular to the first direction, wherein:
a bottom part of the channel layer is embedded in the isolation insulating layer, and
a width of the bottom part of the channel layer in the second direction is smaller than a largest width of the channel layer in the second direction.

14. The semiconductor device of claim 13, wherein the oxide layer includes SiGe oxide.

15. The semiconductor device of claim 14, wherein the oxide layer does not include a semiconductor SiGe.

16. The semiconductor device of claim 13, wherein the channel layer does not contain Ge.

17. The semiconductor device of claim 13, wherein the oxide layer is fully embedded in the isolation insulating layer.

18. The semiconductor device of claim 17, wherein a thickness of the oxide layers is in a range of 5 nm to 25 nm.

19. The semiconductor device of claim 13, wherein the channel layer has a portion in contact with an upper surface of the isolation insulating layer.

20. The semiconductor device of claim 13, wherein an oxide layer is disposed between a side surface of the channel layer and the isolation insulating layer.

* * * * *